(12) United States Patent
Kumakawa

(10) Patent No.: US 7,808,059 B2
(45) Date of Patent: Oct. 5, 2010

(54) SEMICONDUCTOR SUBSTRATE, AND SEMICONDUCTOR DEVICE AND METHOD OF MANUFACTURING THE SEMICONDUCTOR DEVICE

(75) Inventor: Takahiro Kumakawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 458 days.

(21) Appl. No.: 11/797,292

(22) Filed: May 2, 2007

(65) Prior Publication Data

US 2007/0264803 A1 Nov. 15, 2007

(30) Foreign Application Priority Data

May 12, 2006 (JP) ............................. 2006-133160

(51) Int. Cl.
*H01L 29/78* (2006.01)
(52) U.S. Cl. ....................................... 257/416; 257/419
(58) Field of Classification Search ................. 257/416, 257/419
See application file for complete search history.

(56) References Cited

U.S. PATENT DOCUMENTS 5,314,844 A * 5/1994 Imamura ........................ 225/2
7,211,526 B2 5/2007 Iri et al. ....................... 438/797
7,468,310 B2 12/2008 Yamazaki et al. ........... 438/463

FOREIGN PATENT DOCUMENTS

| JP | 05-285935 | 11/1993 |
| JP | 2001-127008 | 5/2001 |
| JP | 3408805 | 3/2003 |
| JP | 2004-363517 | 12/2004 |
| JP | 2005-116844 | 4/2005 |

* cited by examiner

*Primary Examiner*—Douglas M Menz
(74) *Attorney, Agent, or Firm*—Steptoe & Johnson LLP

(57) ABSTRACT

In a semiconductor substrate 1, a plurality of semiconductor elements 2 having diaphragm structures are formed in the form of cells in the longitudinal direction and the lateral direction, and V-grooves 3 are formed by anisotropic etching continuously on only division lines 4 parallel formed in one direction, out of the division lines 4 which are orthogonal to each other and divide the respective semiconductor elements 2 individually.

10 Claims, 6 Drawing Sheets

A-A' SECTION

B-B' SECTION

B-B' SECTION

C-C' SECTION

SEMICONDUCTOR SUBSTRATE, AND SEMICONDUCTOR DEVICE AND METHOD OF MANUFACTURING THE SEMICONDUCTOR DEVICE

The present application claims priority to Japanese Patent Application No. 2006-133160, filed May 12, 2006, which application is incorporated herein by reference in its entirety.

FIELD OF THE INVENTION

The present invention relates to a semiconductor substrate having a diaphragm structure and a beam structure formed by thinning a part of the semiconductor substrate, which is typified by MEMS (Micro Electro Mechanical System), and a semiconductor device manufactured by dividing the semiconductor substrate and a manufacturing method of the semiconductor device.

BACKGROUND OF THE INVENTION

In the semiconductor devices which are manufactured by the above described MEMS and have diaphragm structures and beam structures that are partially thinned, MEMS pressure sensors and MEMS acceleration sensors are included. Such sensors are generally manufactured by dividing a plurality of the above described diaphragm structures and beam structures individually after the diaphragm structures and beam structures are simultaneously formed in the semiconductor wafer process. For the division, the method for performing crushing by rotating a ring-shaped dicing saw in which particles of diamond and CBN are held by a bond material at a high speed is most commonly used. Since the machining by the dicing saw is performed while cutting water is run for washing out crushed chips and cooling down the frictional heat, and the diaphragm structures and the beam structures are brittle structures, there has been the problem that the diaphragm structures and the beam structures are broken due to the pressure of the cutting water during machining by the dicing saw.

In recent years, as a method for solving such a problem, machining by laser light has attracted attention, and an example of such machining is disclosed in, for example, Japanese Patent No. 3408805.

In the manufacturing method by laser light disclosed in Japanese Patent No. 3408805, a modified region by multiphoton absorption is formed in a semiconductor wafer, and the semiconductor wafer is divided by cleavage with the modified region as the starting point. Multiphoton absorption is the phenomenon in which even when energy of photon is smaller than the band gap of absorption of the material, namely, even when photon is optically transmitted, by making the intensity of light very high, absorption occurs in the material. By aligning the focusing point of laser light with the inside of the semiconductor wafer, the phenomenon of multiphoton absorption is caused, and the modified region is formed inside the semiconductor wafer. Then, by easily breaking the substrate along the dicing lane, with the modified region formed as the starting point, division without requiring cutting water is enabled.

The above described method for machining by laser light will be described based on the drawings. FIG. 9 is a plane view showing the division lines and the periphery of the semiconductor substrate which is a lased machining workpiece, and FIG. 10 is a sectional view taken along the line C-C' shown in FIG. 9 during laser processing. In FIGS. 9 and 10, reference numeral 101 denotes a semiconductor substrate, reference numeral 102 denotes a semiconductor element which constitutes the semiconductor device formed in the semiconductor substrate 101, reference numeral 104 denotes the division line of the semiconductor element 102, reference numeral 108 denotes laser light, reference numeral 109 denotes a modified region, and reference numeral 110 denotes a cut portion (crack) occurring with the modified region 109 as the starting point.

The process of the method of machining by laser light will be described hereinafter.

First, the focusing point of the laser light 108 is aligned with the inside of the semiconductor substrate 101, and multiphoton absorption is caused in a predetermined thickness direction.

Next, by scanning the laser light 108 along the center of the division line 104 while causing multiphoton absorption continuously or intermittently, the modified region 109 along the division line 104 is formed inside the semiconductor substrate 101, and the cut portion 110 is formed.

Next, an external force is simultaneously applied to both ends of the semiconductor substrate 101, the semiconductor substrate 101 is split with the modified region 109 as the starting point, and the semiconductor device is formed. Since at this time, the cut portion 110 is formed with the modified region 109 as the starting point, the semiconductor substrate 101 can be easily broken with a relatively small external force. Especially when the semiconductor substrate 101 is thin, the semiconductor substrate 101 splits naturally in the thickness direction even if the external force is not especially applied to the semiconductor substrate 101.

Other than the above described method for machining by laser light, as the method for solving the problem in which diaphragm structures and beam structures are broken by the pressure of cutting water, reducing the thickness of the machined portion by forming in advance a groove on the division line by anisotropic etching or the like is performed. This method is disclosed in, for example, Japanese Patent Laid-Open No. 2001-127008.

In the manufacturing method disclosed in Japanese Patent Laid-Open No. 2001-127008, an etching protection film is formed on the semiconductor substrate of an orientation plane (100) so as to open the division line in the longitudinal direction and the lateral direction first, and thereafter, anisotropic etching is performed. Herein, etching is stopped on an orientation plane (111), and therefore, a V-groove with the angle of inclination of 54.7 degrees is formed. Next, an external force is applied to the semiconductor substrate so that the V-groove is enlarged to divide the semiconductor substrate along the V-groove, and the individual semiconductor devices are formed.

However, in the above-described known laser machining method disclosed in Patent Document 1, the following problem arises.

When the semiconductor substrate is thick, the semiconductor substrate cannot be divided with the modified region by one scanning. Therefore, a plurality of modified regions are required to be formed parallel to the thickness direction by carrying out laser machining a plurality of times, and this leads to increase in tact required for machining.

In the above-described known method of manufacturing in which the V-groove is formed, disclosed in Patent Document 2, the following problem arises.

Since in the portion where the V-grooves intersect with each other in the longitudinal direction and the lateral direction of the division lines, erosion of anisotropic etching differs from that in the other portions, etching does not stop in the orientation plane (111) if etching is performed excessively, and etching advances into an orientation plane (211), for example. In other words, when the V-groove is to be formed simultaneously with the step of forming the diaphragm structure requiring etching which is deeper than, for example, the V-groove, the intersection portions of the V-grooves are excessively etched, and the semiconductor substrate is penetrated. Therefore, the strength of the semiconductor substrate is extremely reduced, and the semiconductor substrate is broken at the time of handling the semiconductor substrate.

DISCLOSURE OF THE INVENTION

The present invention has an object to solve these problems and provide a semiconductor substrate capable of improving machining tact without degrading quality of division when dividing the semiconductor substrate into individual semiconductor devices, a semiconductor device and a method of manufacturing the semiconductor device.

In order to attain this object, the semiconductor substrate of the present invention includes grooves continuously formed on only the division lines formed parallel in one direction, out of the division lines in the longitudinal direction and the lateral direction to individually divide a plurality of semiconductor elements formed in a shape of cells in the longitudinal direction and the lateral direction.

With this configuration, the grooves are formed on only the division lines formed parallel in one direction, out of the division lines orthogonal to each other in the longitudinal direction and the lateral direction, whereby, the thickness of the semiconductor substrate in the division line portions where the grooves are formed is thin and is notched, and can have the structure in which stress easily concentrates when division by cleavage or the like is performed.

The method of manufacturing the semiconductor device of the present invention comprises a step of forming grooves by etching continuously on only division lines formed parallel in one direction, out of the division lines in the longitudinal direction and the lateral direction in order to individually divide a plurality of semiconductor elements formed in the form of cells in the longitudinal direction and the lateral direction in the semiconductor substrate, a step of forming modified regions inside the semiconductor substrate by irradiating laser light along the division lines in the aforesaid longitudinal direction and lateral direction respectively with the focal points aligned with the inside of the aforesaid semiconductor substrate, and a step of forming individual semiconductor devices by dividing the semiconductor substrate along the division lines in the longitudinal direction and lateral direction by applying an external force to the aforesaid semiconductor substrate.

By this manufacturing method, the grooves are formed by etching so as to be in series on only the division lines formed parallel in one direction, out of the division lines orthogonal to each other in the longitudinal direction and the lateral direction, and thus, the intersection portions of the grooves for which control of etching is extremely difficult are not formed. Therefore, stable grooves can be formed extremely easily. The substrate is divided into the individual semiconductor devices along the division lines where the continuous grooves are formed, so that as compared with the case where the grooves are not formed, division with excellent straightness can be performed easily.

The semiconductor device of the present invention is a semiconductor device manufactured by the above described method, wherein chamfering is performed for only two sides opposed to each other in a back surface side of each of the individual semiconductor devices.

With this configuration, chamfering is performed for the two sides opposed to each other on the back surface side, and therefore, during substrate mounting which is the post process thereof, the die bond material used in bonding of the semiconductor device and the substrate can be restrained from creeping up to the side surface of the semiconductor device. Since chamfering is not performed to the other two sides, the area of the back surface of the semiconductor device is not reduced, and bond area during tie bonding can be secured.

DESCRIPTION OF THE EMBODIMENT(S)

An embodiment of the present invention will now be described with reference to the drawings.

Figure 1:
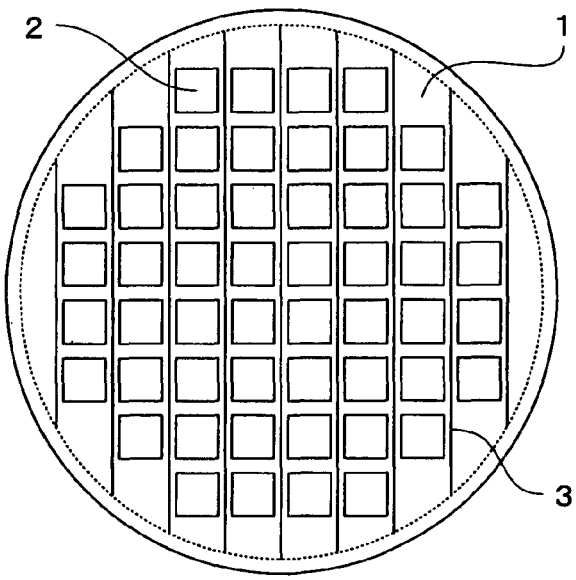
FIG. 1 is a plane view of a semiconductor substrate in one embodiment of the present invention.
Figure 2:
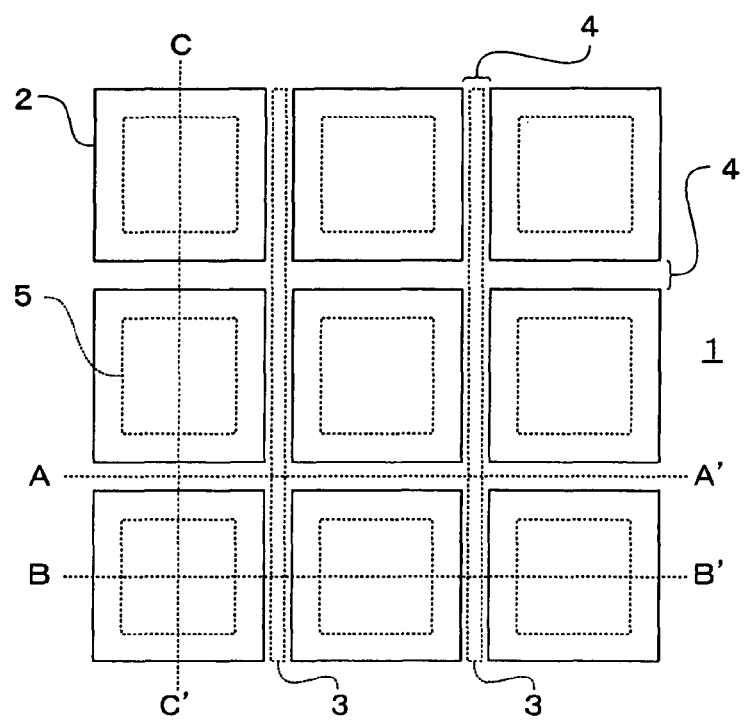
FIG. 2 is a plane view showing a periphery of division lines of the semiconductor substrate.
Figure 3A:
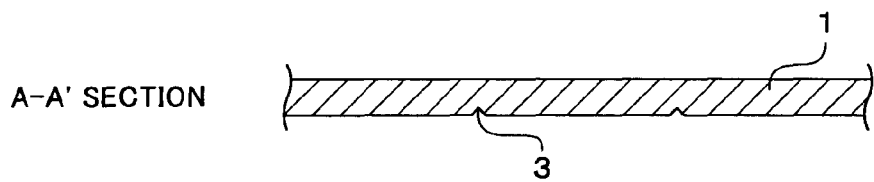
FIGS. 3A and 3B are a sectional view taken along the line A-A' and a sectional view taken along the line B-B' in FIG. 2.

With reference to FIGS. 1 to 3, a semiconductor substrate of the present invention will be described. In FIGS. 1 to 3, reference numeral 1 denotes a semiconductor substrate made of Si single crystal, reference numeral 2 denotes a semiconductor element constituting a semiconductor device, reference numeral 3 denotes a V-groove (one example of a groove), reference numeral 4 denotes a division line and reference numeral 5 denotes a diaphragm.

A plurality of semiconductor elements 2 are formed in the form of cells in the longitudinal direction and the lateral direction in the semiconductor substrate 1 as shown in FIGS. 1 and 2.

A plurality of semiconductor elements 2 are divided by the division lines 4 as shown in FIG. 2. In this case, the division lines 4 are division regions set when the semiconductor elements 2 are divided individually from the semiconductor substrate 1. The division lines 4 are formed so as to be orthogonal (cross) in the longitudinal direction and the lateral direction, and as shown in FIGS. 1 to 3, out of the division lines orthogonal to each other, on only the division lines parallel with one of the longitudinal direction and the lateral direction (in the drawing, on the division lines in the longitudinal direction), the V-grooves 3 are formed. These V-grooves 3 are formed by the orientation planes (111) with the inclination angle of 54.7 degrees, for example.

Figure 3B:
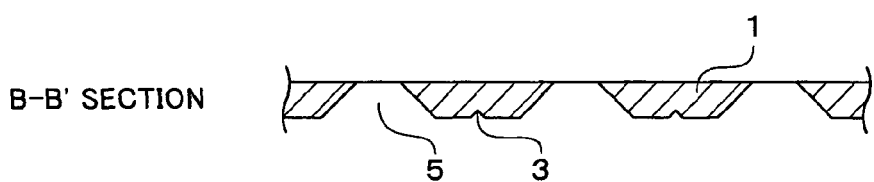

As shown in FIG. 3B, the diaphragm 5 is formed in each of the semiconductor elements 2.

As described above, the V-grooves 3 are formed on only the division lines parallel in one direction, out of the division lines 4 orthogonal to each other in the longitudinal direction and the lateral direction, so that the semiconductor substrate 1 in the portions of the division lines 4 where the V-grooves 3 are formed is small in thickness, is in a notched shape, and can have the structure where stress easily concentrates when division by cleavage or the like is performed. Therefore, when the modified region to be the starting point for dividing the semiconductor substrate 1 into the individual semiconductor elements 2 is formed inside the semiconductor substrate 1, in the step of dividing the semiconductor substrate 1 into the individual semiconductor elements 2 which is a post process, the number of times of laser light scanning can be made smaller as compared with that in the case of the division line in which no groove is formed, as a result of which, machining tact can be made short, and stable division with favorable straightness is enabled.

Next, with reference to FIG. 4 and FIGS. 5A to 5F, a method of manufacturing the semiconductor device of the present invention will be described. In FIGS. 5A to 5F, reference numeral 6 denotes an etching mask, reference numeral 7 denotes an expanded tape, reference numeral 8 denotes laser light, reference numeral 9 denotes a modified region, reference numeral 10 denotes a crack (cut portion) with the modified region as a starting point, and reference numeral 11 denotes a semiconductor device after individual semiconductor elements 2 are cut out from the semiconductor substrate 1.

Figure 4:
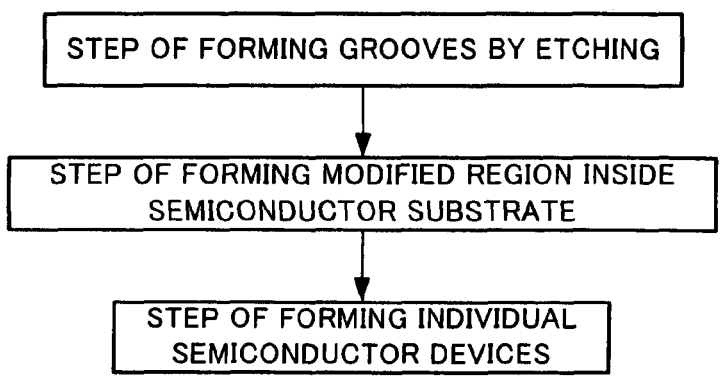
FIG. 4 is a flow chart of a method of manufacturing a semiconductor device in one embodiment of the present invention.

As shown in FIG. 4, the method of manufacturing the semiconductor device of the present invention comprises the following steps of: "forming V-grooves continuously on only division lines parallel in the longitudinal direction by anisotropic etching" (forming grooves by etching); "forming modified regions inside the semiconductor substrate by irradiating laser light along the orthogonal division lines with the focal points aligned with the inside of the semiconductor substrate" (forming the modified regions inside the semiconductor substrate); and "dividing the semiconductor substrate into individual semiconductor devices along the orthogonal division lines by applying an external force to the semiconductor substrate" (forming the individual semiconductor devices) in this sequence.

First, "the step of forming the V-grooves continuously on only the division lines parallel in the longitudinal direction by anisotropic etching" will be described.

Figure 5A:
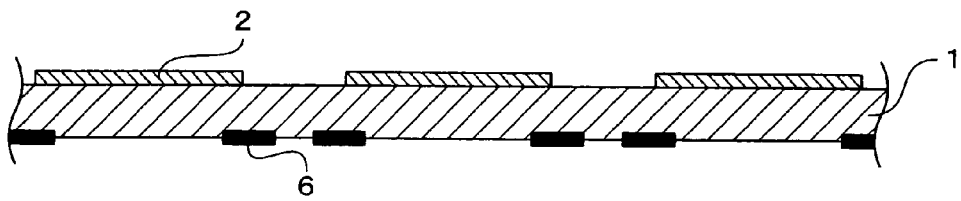
FIGS. 5A to 5F are sectional views of the semiconductor substrate showing the process steps of the method of manufacturing the semiconductor device in sequence by using the sectional views taken along the line B-B' shown in FIG. 4.

Namely, as shown in FIG. 5A, first, the etching mask 6 is formed on the semiconductor substrate 1 on which a plurality of semiconductor elements 2 are formed, and division lines (not shown) for dividing the individual semiconductor elements 2 are set. The etching mask 6 is formed so that the regions where the diaphragms 5 and the V-grooves 3 are desired to be formed are opened. At this time, the openings of the etching mask 6 for forming the V-grooves 3 are formed on only the division lines 4 parallel in one direction.

In this case, for example, the etching mask 6 is formed by forming a material such as a silicon oxide film by using a CVD method, and then, patterning the material with a lithography technique. Though not shown, the etching mask is left on the entire surface where the semiconductor elements 2 are formed.

Figure 5B:
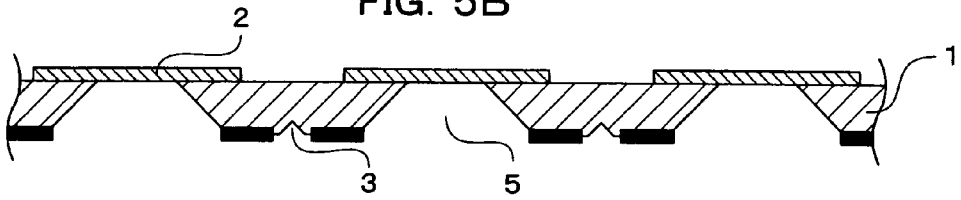

Next, as shown in FIG. 5B, the diaphragms 5 and the V-grooves 3 are formed by anisotropic etching. In this case, as an anisotropic etching solution, for example, a KOH solution, and a TMAH (tetramethylammonium hydroxide) solution are used. At this time, the V-grooves 3 are formed on only the division lines 4 parallel in one direction, and thus, the V-grooves 3 do not have the intersecting patterns. Therefore, etching of the semiconductor substrate 1 comprised of the Si single crystal substrate does not cause abnormal erosion in the intersecting patterns, and reliably stops the process of etching on the orientation plane (111). Therefore, even when the diaphragms 5 and the V-grooves 3 differing in etching depth are simultaneously formed, they can be stopped in the depth at an inclination angle of 54.7 degrees. In other words, the depth and width of the V-groove 3 can be determined by the opening width of the etching mask 6.

Figure 5C:
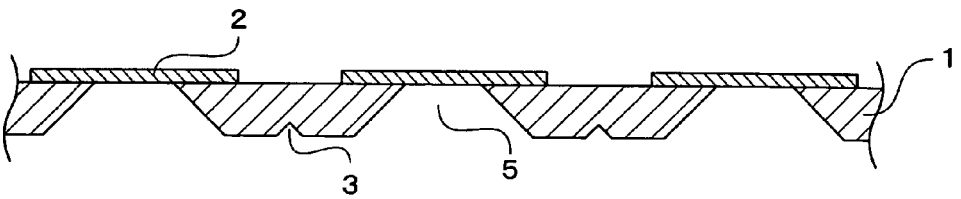

Next, as shown in FIG. 5C, the etching mask 6 is removed. For removing the etching mask 6, for example, a BHF solution is used. Herein, the etching mask 6 is removed, but unless removal is especially necessary, the etching mask 6 may be left.

Subsequently, "the step of forming the modified region inside the semiconductor substrate by irradiating laser light along the orthogonal division lines respectively with the focal points aligned with the inside of the semiconductor substrate" will be described.

Figure 5D:
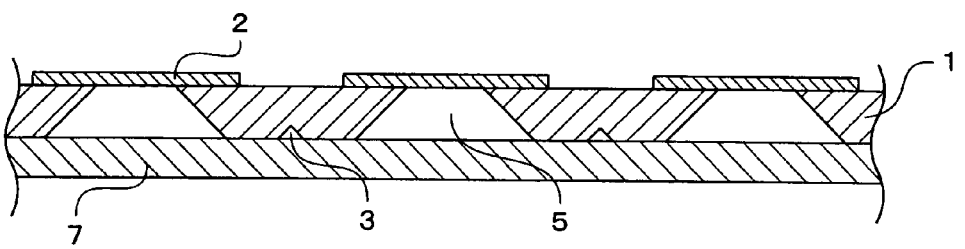

That is, as shown in FIG. 5D, the semiconductor substrate 1 is mounted to the expanded tape 7 first.

Figure 5E:
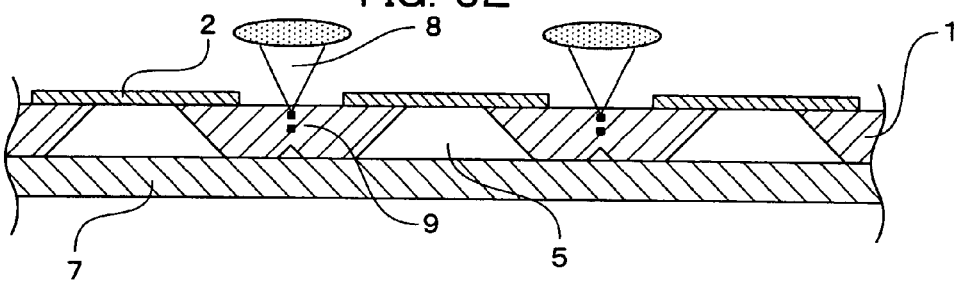

Next, as shown in FIG. 5E, laser light 8 is irradiated along the division lines 4 orthogonal to each other respectively with the focal points aligned with the inside of the semiconductor substrate 1, and the modified regions 9 are formed inside the semiconductor substrate 1. At this time, scanning of the laser light 8 in the longitudinal direction is carried out along the lines of the V-grooves 3 and is carried out so that micro-cracks occurring from the modified regions 9 develop into the V-grooves 3.

Subsequently, "the step of dividing the semiconductor substrate into the individual semiconductor devices along the division lines orthogonal to each other by applying an external force to the semiconductor substrate" which is carried out finally will be described.

Figure 5F:
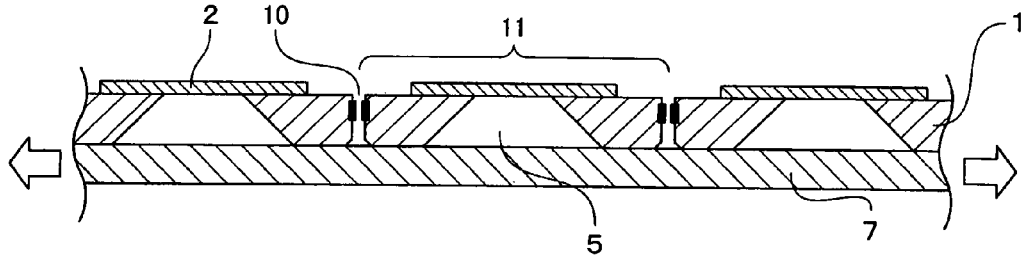

Specifically, as shown in FIG. 5F, by applying the external force to the expanded tape 7, the cracks 10 are developed from the modified regions 9 formed respectively along the division lines 4 orthogonal to each other to divide the semiconductor substrate 1, whereby the individual semiconductor devices 11 are formed.

Figure 6A:
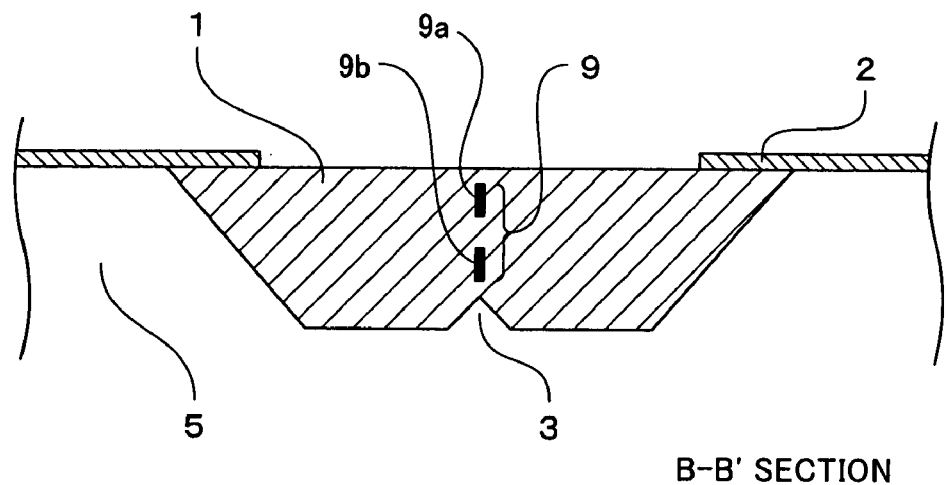
FIGS. 6A and 6B are sectional views showing the method of manufacturing the semiconductor device.
Figure 6B:
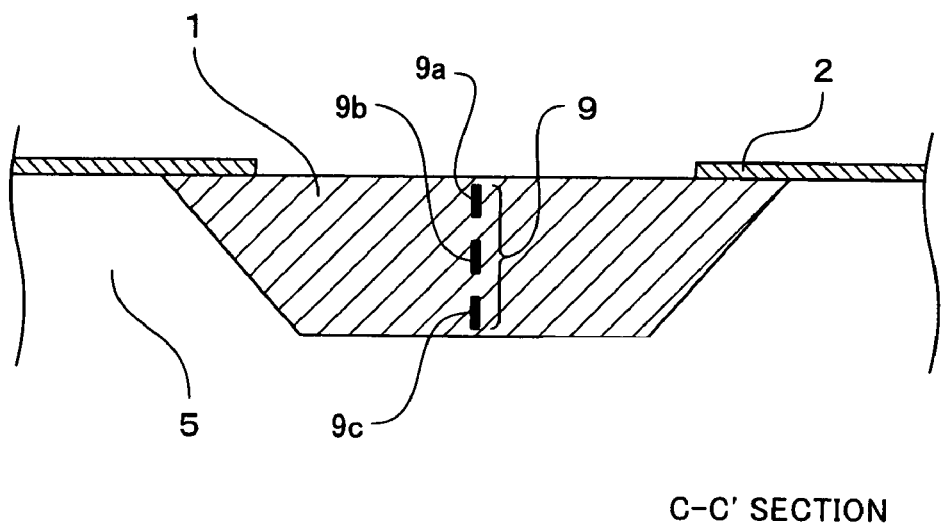

Here, when the semiconductor substrate 1 is thick, division can be facilitated by forming a plurality of modified regions 9 by carrying out scanning of the laser light 8 a plurality of times, but as shown in FIGS. 6A and 6B, division is possible if the number of times of scanning the laser light 8 along the division lines 4 where the V-grooves 3 are formed is smaller than the number of times of scanning the laser light 8 along the division lines 4 where the V-grooves 3 are not formed.

FIG. 6A is an enlarged sectional view taken along the B-B' line of the above described semiconductor substrate 1, and shows modified regions 9a and 9b in the depth direction formed along the division line 4 where the V-groove 3 is formed when the number of times of scanning of the laser light 8 is two. FIG. 6B is an enlarged sectional view taken along the line C-C' of the semiconductor substrate 1 in the longitudinal direction along the semiconductor element 2 with the diaphragm 5 formed therein, and shows modified regions 9a, 9b and 9c in the depth direction formed along the division line 4 where the V-groove 3 is not formed when the number of times of scanning of the laser light 8 is three.

As described above, with the configuration of the semiconductor substrate 1 and by the method of manufacturing the semiconductor device 11, when forming the modified region 9 to be the starting point for dividing the semiconductor substrate 1 into the individual semiconductor devices 11, the number of times of scanning the laser light 8 along the division line 4 where the V-groove 3 is formed can be made smaller than the number of times of scanning the laser light 8 along the division line 4 without the V-groove 3, the machining tact can be shortened, and stable division with favorable straightness is enabled.

Since the V-grooves 3 are formed by etching so as to be in series on only the division lines formed parallel in one direction, out of the division lines 4 orthogonal to each other, the intersection portions of the V-grooves 3 for which control of etching is extremely difficult are not produced, and thereby, the stable V-grooves 3 can be formed extremely easily. Since the semiconductor substrates 1 is divided into the individual semiconductor devices 11 along the division lines 4 where the continuous V-grooves 3 are formed, division with excellent straightness can be made easily as compared with the case where the V-grooves 3 are not formed.

Formation of the V-grooves 3 is performed simultaneously with the anisotropic etching step of forming the diaphragm structure. Therefore, the step is not especially increased, and increases in cost and in lead time can be avoided.

Figure 7:
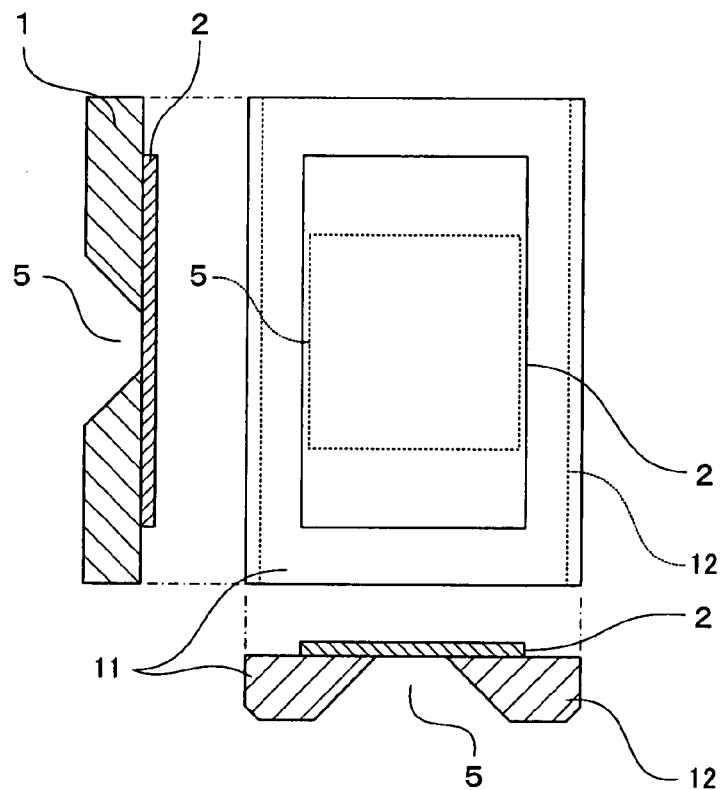
FIG. 7 shows a plane view, a cross-sectional view and a longitudinal sectional view of the semiconductor device after being divided from the semiconductor substrate in one embodiment of the present invention.

The semiconductor devices 11 individually divided from the semiconductor substrate 1 by the above described method of manufacturing the semiconductor device 11 becomes the semiconductor devices each having the diaphragm structure as shown in FIG. 7. In FIG. 7, reference numeral 11 denotes the semiconductor device after being individually divided, reference numeral 12 denotes a chamfer which is made when the semiconductor device is divided with the vertex of the V-groove as the starting point, and the chamfers 12 are formed at only two sides opposed to each other in the back surface side of the individual semiconductor device 11.

As shown in FIG. 7, the portion of the chamfer 12 corresponding to the portion where the V-groove 3 is formed is disposed at the long side of the semiconductor device 11. That is, as the division line 4 where the V-groove 3 is formed, the division line along the long side of the semiconductor device 11 is selected, and the V-groove 3 is formed thereon.

Semiconductor devices are generally broken easily when they are slim, and the starting point of breakage is a crack formed at the long side. Thus, by chamfering the long side, the crack to be the starting point is eliminated, and therefore, the transverse strength of the semiconductor device is remarkably increased. In other words, chipping of the long side which leads to reduction in the transverse strength of the semiconductor device 11 is suppressed, and the semiconductor device 11 with excellent mechanical strength can be obtained. Since chamfering is not performed for the short sides, the area of the back surface of the semiconductor device 11 at the short side is not reduced, and the bond area during die bonding can be secured.

Figure 8:
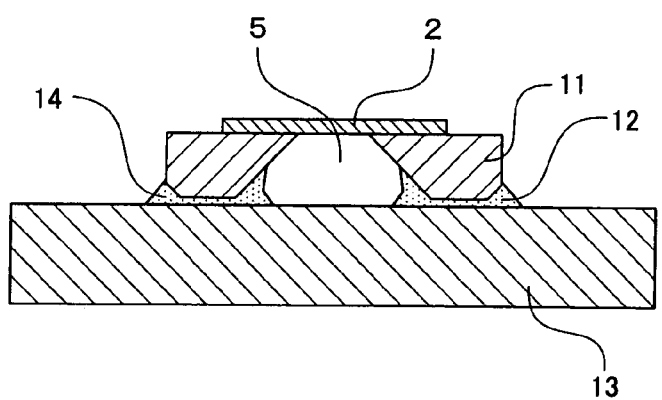
FIG. 8 is a sectional view of a semiconductor substrate on which the semiconductor device is mounted.
Figure 9:
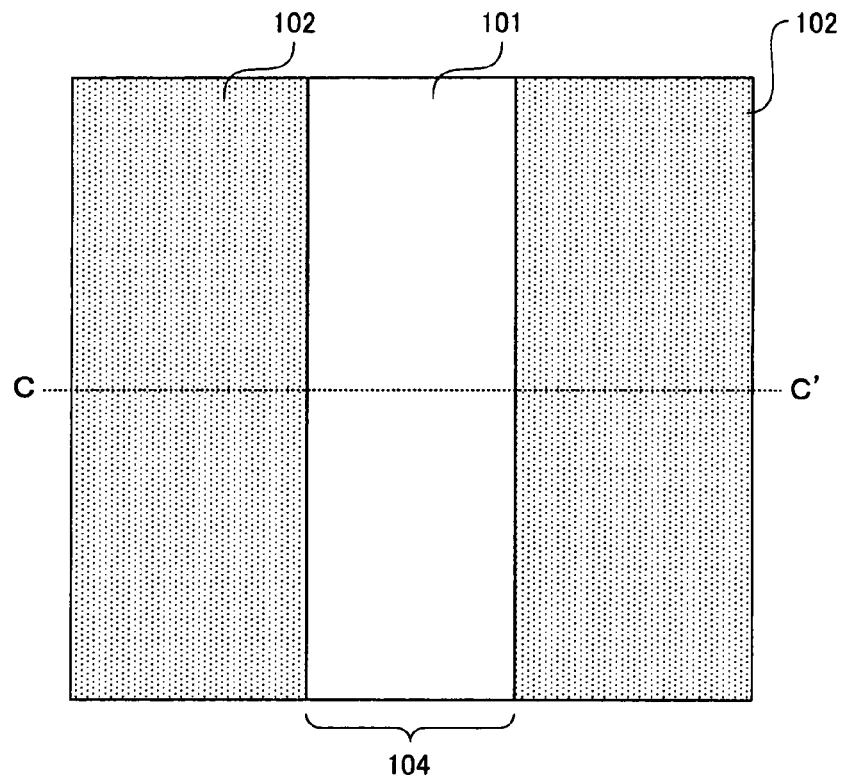
FIG. 9 is a plane view of a conventional semiconductor substrate.
Figure 10:
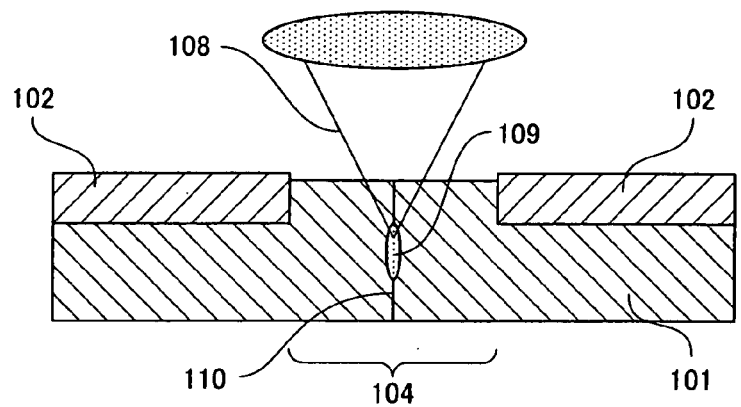
FIG. 10 is a sectional view showing a method of manufacturing a conventional semiconductor device.

FIG. 8 shows a sectional view of the state in which the semiconductor device of the present invention is mounted on a substrate. In FIG. 8, reference numeral 13 denotes a mounting substrate, and reference numeral 14 denotes a die bond material for bonding the mounting substrate 13 and the semiconductor device 11.

Bonding of the semiconductor device 11 and the mounting substrate 13 is usually performed with the die bond material 14. When the bonding is performed, the coating amount of the die bond material 14 needs to be strictly controlled in order to control creeping-up to the side surface of the semiconductor device 11. As shown in FIG. 8, when the chamfer 12 is applied to the semiconductor device 11, creeping-up of the die bond material to the side surface of the semiconductor device 11 is suppressed by the surface tension of the chamfer 12, and therefore, control can be made extremely easy as compared with the conventional unit. Since chamfering is not performed for the other two sides (the short sides), the area of the back surface of the semiconductor device 11 at the short side is not reduced, and the bond area during die bonding can be secured.

In this embodiment, the semiconductor substrate 1 and the semiconductor device 11 include the diaphragm structures formed therein, but may not be especially limited to the diaphragm structure.

In this embodiment, the grooves formed on only the division lines formed parallel in one of the longitudinal direction and the lateral direction, out of the division lines orthogonal to each other, are formed in the V-grooves, but the grooves are not limited to the V-grooves, and may be formed in the U-shaped grooves. The grooves are formed by anisotropic etching, but can be formed by dry etching.

The semiconductor substrate, and the semiconductor device and the method of manufacturing the semiconductor device of the present invention are suitable for manufacturing the semiconductor device without increasing the machining cost and reducing the quality of machining in division of the silicon substrate and the compound semiconductor substrate, and are useful for division especially when manufacturing an MEMS sensor and the like having diaphragm structures.

What is claimed is:

1. A semiconductor substrate comprising:
a plurality of semiconductor elements each comprising a MEMS device, and each including a thinned portion of the semiconductor substrate;
first direction division lines;
second direction division lines intersecting the first direction division lines;
a groove formed on each first direction division line; and
a modified region formed along each of the first direction division lines and second direction division lines,
wherein each semiconductor element is surrounded by first direction division lines and second direction division lines and the grooves do not intersect each other.

2. The semiconductor substrate according to claim 1, wherein the thinned portion is a diaphragm structure of a MEMS device.

3. The semiconductor substrate according to claim 1, wherein the grooves are a V-shaped grooves.

4. The semiconductor substrate according to claim 1, wherein the grooves are formed only on the first direction division lines.

5. The semiconductor substrate according to claim 1, wherein the grooves are formed by etching, and the modified region is laser-formed.

6. The semiconductor substrate according to claim 1, wherein the semiconductor substrate is a silicon substrate.

7. The semiconductor substrate according to claim 1, wherein the grooves are U-shaped grooves.

8. The semiconductor substrate according to claim 1, wherein the grooves are made by anisotropic etching.

9. The semiconductor substrate according to claim 1, wherein the MEMS devices are MEMS pressure sensors.

10. The semiconductor substrate according to claim 1, wherein the MEMS devices are MEMS acceleration sensors.

* * * * *